United States Patent
Gao et al.

(10) Patent No.: US 11,899,936 B2
(45) Date of Patent: Feb. 13, 2024

(54) DATA TRANSMISSION CIRCUIT, METHOD AND STORAGE DEVICE

(71) Applicant: ChangXin Memory Technologies, Inc., Hefei (CN)

(72) Inventors: Enpeng Gao, Hefei (CN); Kangling Ji, Hefei (CN); Zengquan Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 141 days.

(21) Appl. No.: 17/626,788

(22) PCT Filed: Aug. 19, 2021

(86) PCT No.: PCT/CN2021/113443
§ 371 (c)(1),
(2) Date: Jan. 12, 2022

(87) PCT Pub. No.: WO2022/205746
PCT Pub. Date: Oct. 6, 2022

(65) Prior Publication Data
US 2023/0280903 A1     Sep. 7, 2023

(30) Foreign Application Priority Data
Mar. 29, 2021   (CN) .......................... 202110336656.0

(51) Int. Cl.
G06F 3/06        (2006.01)

(52) U.S. Cl.
CPC ............ *G06F 3/061* (2013.01); *G06F 3/0659* (2013.01); *G06F 3/0673* (2013.01)

(58) Field of Classification Search
CPC ....... G06F 3/061; G06F 3/0659; G06F 3/0673
See application file for complete search history.

(56) References Cited

U.S. PATENT DOCUMENTS

| | | | |
|---|---|---|---|
| 2011/0276732 A1* | 11/2011 | Gewirtz | G06F 9/52 710/56 |
| 2019/0311750 A1* | 10/2019 | Han | G11C 7/1039 |
| 2020/0082869 A1* | 3/2020 | Miyamoto | G11C 11/4096 |
| 2020/0098404 A1* | 3/2020 | Kim | G11C 11/4076 |
| 2022/0059143 A1* | 2/2022 | Kim | G11C 29/023 |

* cited by examiner

Primary Examiner — Nanci N Wong
(74) Attorney, Agent, or Firm — Alston & Bird LLP

(57) ABSTRACT

This application relates to a data transmission circuit, a method, and a storage device. The data transmission circuit includes a delay module and a mode register data processing unit. The delay module delays a first preset time when receiving a mode register read command, and generates delayed read command. The mode register data processing unit is connected to the delay module, and reads setting parameters from the mode register in response to the mode register read command, and outputs the setting parameters in response to the delayed read command.

13 Claims, 16 Drawing Sheets

DATA TRANSMISSION CIRCUIT, METHOD AND STORAGE DEVICE

CROSS REFERENCES TO RELATED APPLICATIONS

This application claims the benefit of priority to CN Patent Application 202110336656.0 filed on Mar. 29, 2021, entitled "DATA TRANSMISSION CIRCUIT, METHOD AND STORAGE DEVICE", the contents of which are incorporated herein by reference in its entirety.

TECHNICAL FIELD

This application relates to the field of integrated circuits, and in particular, to a data transmission circuit, method and storage device.

BACKGROUND

A semiconductor memory device usually includes a storage array area and a peripheral circuit area. The storage array area is provided with a storage unit array including a plurality of storage units, and the peripheral circuit area is provided with a control circuit for controlling reading and writing and a mode register for storing setting parameters. The setting parameters stored in the mode register can be read out by issuing the mode register read command. If you can set the transmission path of the response mode register read command to read the setting parameters, share a data transmission channel with the transmission path of the array area data read command in response to the array area data read command, and accurately output the data through the data terminal of the semiconductor storage device. It can effectively reduce the space occupied by the data transmission circuit.

However, for a specific type of semiconductor storage device, the working parameters of its internal working circuit are basically determined, and the determined functional unit circuit generally needs to meet corresponding standards to satisfy the requirements of customer customization and mass production. How to set the response mode register read command to read out the setting parameters under the premise of meeting the working parameter requirements of the specific type of semiconductor storage device, and match the time to read the array area data in response to the array area data read command, so as to realize the response mode register read command and read out the transmission path for the setting parameters, and share a data transmission channel with the transmission path for reading array data in response to the array area data read command. It has become an urgent and difficult technological problem to be solved in the process of designing data transmission circuits in specific types of semiconductor storage devices.

SUMMARY

One embodiment of the disclosure provides a data transmission circuit, including a delay module and a mode register data processing unit, the delay module generates a delayed read command after a first preset time delay from the moment when the mode register read command is received. The register data processing unit is connected to the delay module, and reads the setting parameters from the mode register in response to the mode register read command, and also outputs the setting parameters in response to the delayed read command.

Another embodiment of the present disclosure provides a storage device, including a storage unit array, a mode register, and the above-mentioned data transmission circuit, so that the time for responding to the mode register read command to read the setting parameters is different from the time for responding to the array area data read command. The timing of reading the data in the array area is matched to realize the transmission path for reading the set parameters in response to the mode register read command. It shares a data transmission channel with the transmission path for reading the data in the array area in response to the data read command in the array area, reducing the data transmission circuit occupancy area.

Another embodiment of the present disclosure provides a data transmission method, including: responding to a mode register read command based on a delay module to generate a delayed read command, the operation delay of the delay module is a first preset time; responding to the mode register read command, based on the mode register data processing unit to read the setting parameters from the mode register; and in response to the delayed read command, the mode register data processing unit outputs the setting parameters.

The details of various embodiments of the present invention will be disclosed in the following drawings and descriptions. According to the description in the specification, drawings and claims, those skilled in the art will be able to understand the inventive features, the problems to be solved and the technical effects of the present invention.

BRIEF DESCRIPTION OF THE DRAWINGS

In order to explain the technical solutions of the embodiments of the present disclosure more clearly, the following drawings will briefly be introduced in the description of the embodiments. Obviously, the drawings in the following descriptions are only a few embodiments of the present disclosure. The additional details or examples used to describe the drawings should not be considered as a limitation to the scope of any of the currently described embodiments of the present disclosure, or preferred modes.

FIG. 10b is a schematic diagram of an embodiment of FIG. 10a;

DETAILED DESCRIPTION OF THE PREFERRED EMBODIMENTS

In order to facilitate the understanding of this disclosure, the following will make a more comprehensive description of this disclosure with reference to the relevant drawings. The preferred embodiment of the disclosure is shown in the accompanying drawings. However, this disclosure can be implemented in many different forms and is not limited to the embodiments described herein. On the contrary, the purpose of providing these embodiments is to make the disclosure of this disclosure more thorough and comprehensive.

Unless otherwise defined, all technical and scientific terms used herein have the same meaning as commonly understood by those skilled in the technical field of this disclosure. The terminology used in the specification of the disclosure herein is only for the purpose of describing specific embodiments, and is not intended to limit the disclosure.

In addition, certain terms used throughout the specification and the following claims refer to specific elements. Those skilled in the art will understand that manufacturers can refer to components with different names. This document does not intend to distinguish between components with different names but the same functions. In the following description and examples, the terms "including" and "including" are used openly, and therefore should be interpreted as "including, but not limited to . . . ". Likewise, the term "connected" is intended to express an indirect or direct electrical connection. Correspondingly, if one device is connected to another device, the connection can be done through a direct electrical connection, or through an indirect electrical connection between the other equipment and the connector.

It should be understood that although the terms "first", "second", etc. may be used herein to describe various elements, these elements should not be limited by these terms. These terms are only used to distinguish one element from another element. For example, without departing from the scope of the present disclosure, the first element may be referred to as the second element, and similarly, the second element may be referred to as the first element.

Figure 1:
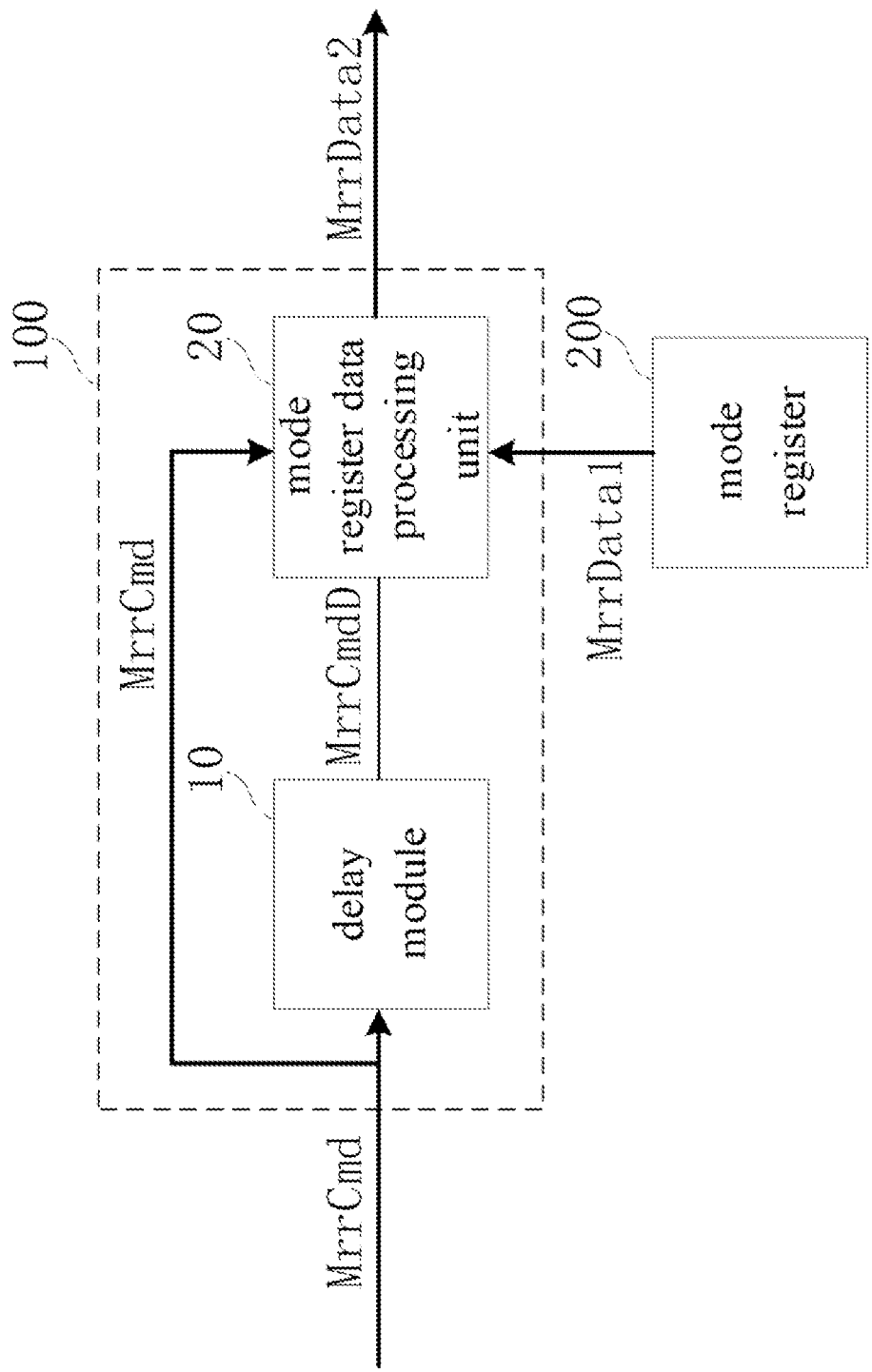
FIG. 1 is a structural block diagram of a data transmission circuit provided in the first embodiment of this disclosure.

Referring to FIG. 1, in an embodiment of the present disclosure, a data transmission circuit 100 is provided, which includes a delay module 10 and a mode register data processing unit 20. The delay module 10 is used to receive the mode register read command MrrCmd from the moment, After delaying the first preset time, a delayed read command MrrCmdD is generated; the mode register data processing unit 20 is connected to the delay module 10, and is used to respond to the mode register read command MrrCmd to read the setting parameter MrrData1 from the mode register 200, and the mode register data processing unit 20. It is also used to output the setting parameter MrrData2 in response to the delayed read command MrrCmdD.

As an example, continue to refer to FIG. 1, by setting the delay module 10 from the moment when the mode register read command MrrCmd is received, after delaying the first preset time, the delayed read command MrrCmdD is generated, so that the mode register data processing unit 20 responds to the mode register read command MrrCmd reads the setting parameter MrrData1 from the mode register 200, and outputs the setting parameter MrrData2 in response to the delayed read command MrrCmdD; the delay time of the delay module 10 can be set according to specific needs, so that the response mode register read command MrrCmd reads the time of the set parameter MrrData2, Matching with the time of reading array area data in response to the array area data read command, realizes the transmission path of responding to the mode register read command to read out the setting parameters, and shares a data transmission channel with the transmission path of responding to the array area data read command to read array area data, in order to reduce the area occupied by the data transmission circuit. The MrrData1 and MrrData2 here can be the same or can match a preset algorithm.

Figure 2:
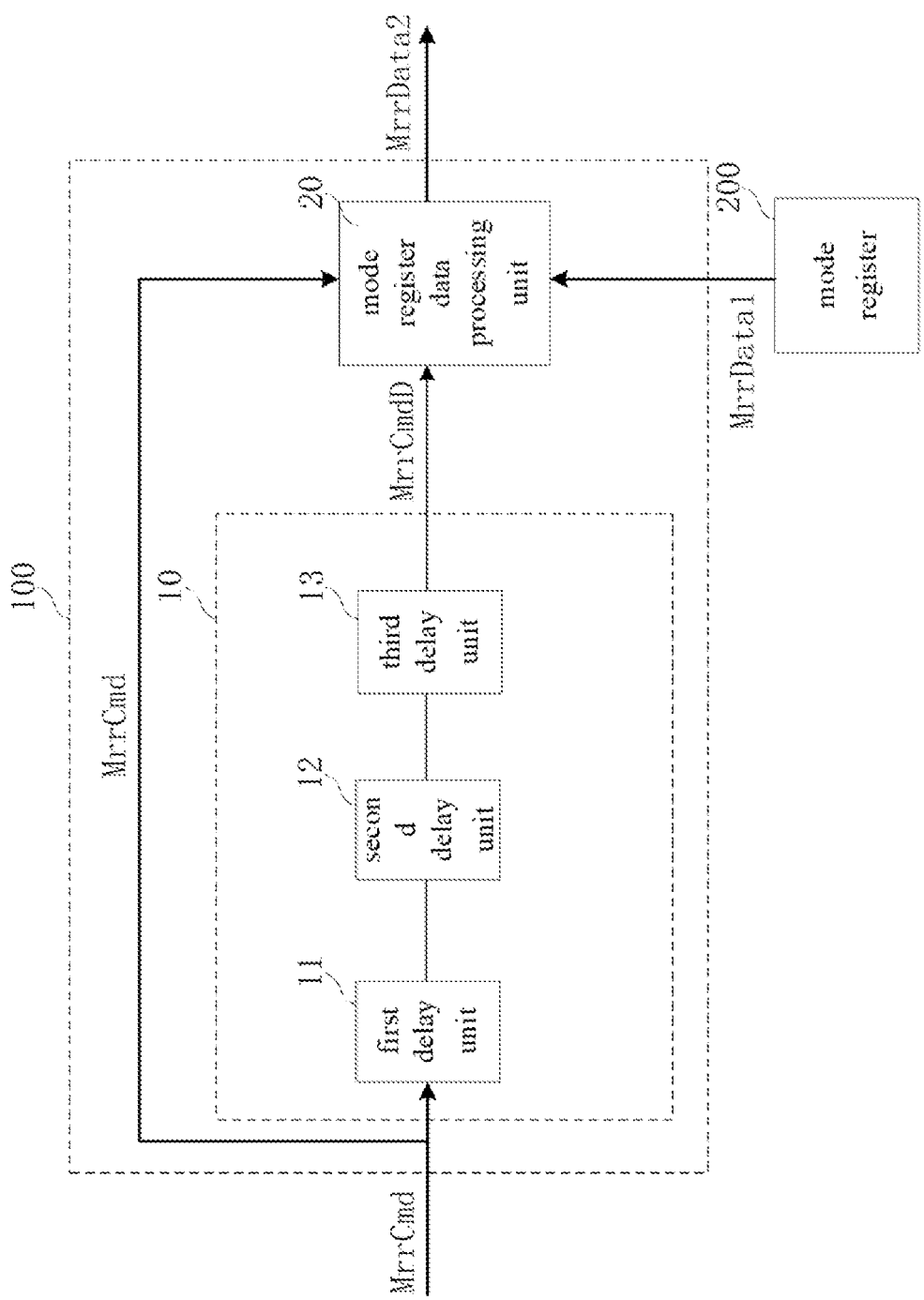
FIG. 2 is a structural block diagram of a data transmission circuit provided in the second embodiment of this disclosure.

Further, referring to FIG. 2, in an embodiment of the present disclosure, the delay module 10 includes a first delay unit 11, a second delay unit 12, and a third delay unit 13, and the first delay unit 11 is used for the self-receiving mode register, from the moment the read command MrrCmd is delayed for a second preset time, the first delayed read command is generated; the second delay unit 12 is connected to the output terminal of the first delay unit 11, for delaying from the moment of receiving the first delayed read command, after the third preset time, a second delayed read command is generated. The third preset time is equal to the operation delay of the column selection control module; the output terminals of the third delay unit 13 and the second delay unit 12 and the mode register data processing unit 20 are connected to the input terminals of generate a delayed read command after a fourth preset time delay from the moment of receiving the second delayed read command; among them, the sum of the second preset time, the third preset time, and the fourth preset time is equal to the first preset time.

As an example, please continue to refer to FIG. 2. By setting the delay module 10 so the first delay unit 11, the second delay unit 12, and the third delay unit 13 are connected in series, and the delay time of the second delay unit 12 is set equal to the operation delay of the column selection control module. The sum of the delay time of the first delay unit 11, the delay time of the second delay unit 12, and the delay time of the third delay unit 13 is set equal to the first preset time. As the result, the time for the response mode register read command MrrCmd to read the setting parameter MrrData2 matches the time for reading the data in the array area in response to the array area data read command. The circuit also avoids the influence on the transmission circuit from the operation delay of the column selection control module in the specific type of semiconductor storage devices.

Figure 3:
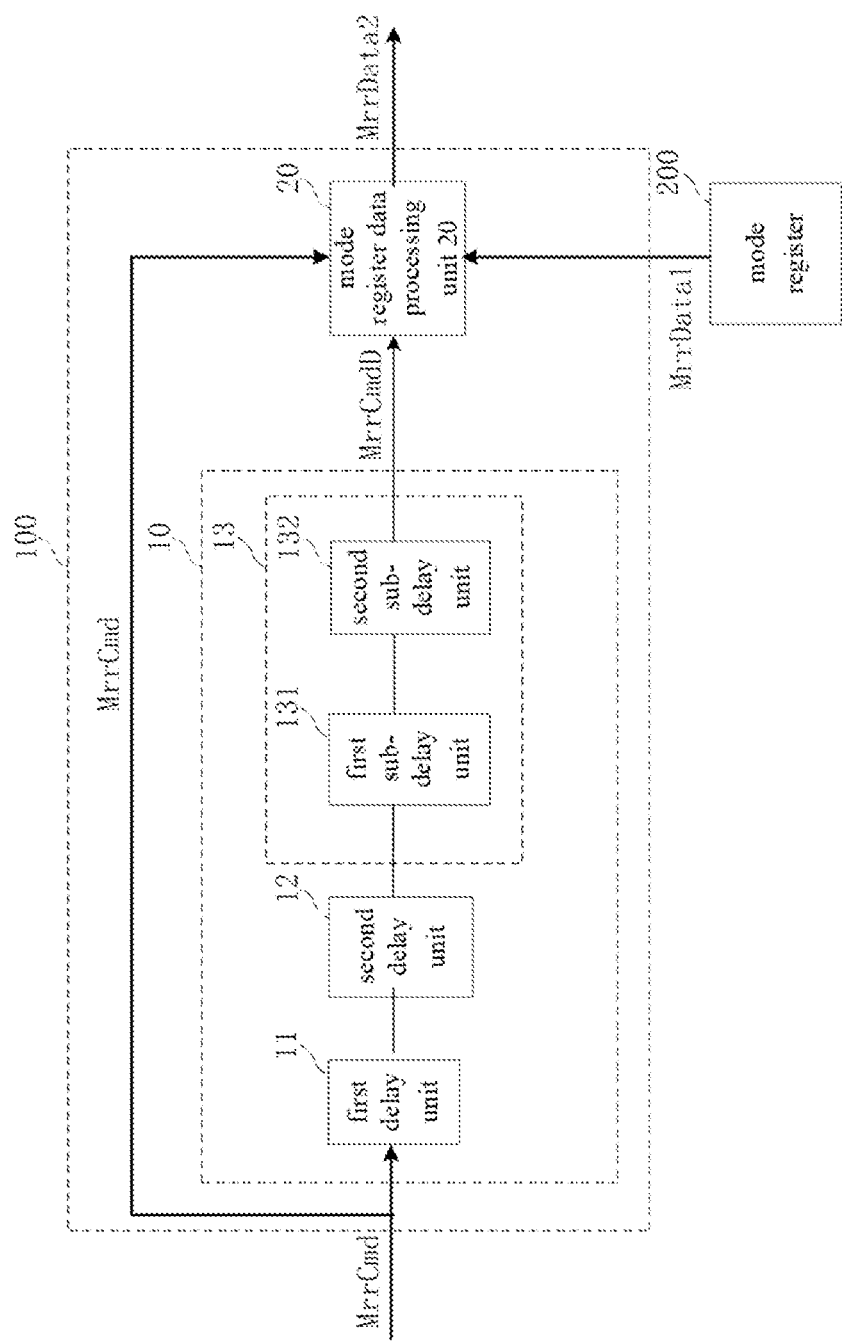
FIG. 3 is a structural block diagram of a data transmission circuit provided in the third embodiment of this disclosure.

Further, please refer to FIG. 3, in an embodiment of the present disclosure, the third delay unit 13 includes a first sub-delay unit 131 and a second sub-delay unit 132, the first sub-delay unit 131 and the output terminal of the second delay unit 12 is connected to generate a third delayed read command after a fifth preset time delay from the moment of receiving the second delayed read command, where the fifth preset time is equal to the operation delay of the read-write amplifier; the second sub-delay unit 132 is connected to the output terminal of the first sub-delay unit 131 and the input terminal of the mode register data processing unit 20, and is used to delay the sixth preset time from the moment of receiving the third delayed read command to generate the delayed read command; wherein the sum of the fifth preset time and the sixth preset time is equal to the fourth preset time.

As an example, please continue to refer to FIG. 3. By setting the third delay unit 13 to include a first sub-delay unit 131 and a second sub-delay unit 132 connected in series, the delay time of the first sub-delay unit 131 is set equal to the operation delay of the read-write amplifier. And set the sum of the delay time of the first sub-delay unit 131 and the delay time of the second sub-delay unit 132 to be equal to the delay time of the third delay unit 13, so that the response mode register read command MrrCmd reads the time of the set parameter MrrData2, and Responding to the data read command in the array area, the time of reading the data in the array area is matched, and the influence of the operation delay of the read-write amplifier in the specific type of semiconductor storage device on the transmission circuit can be avoided.

Figure 4:
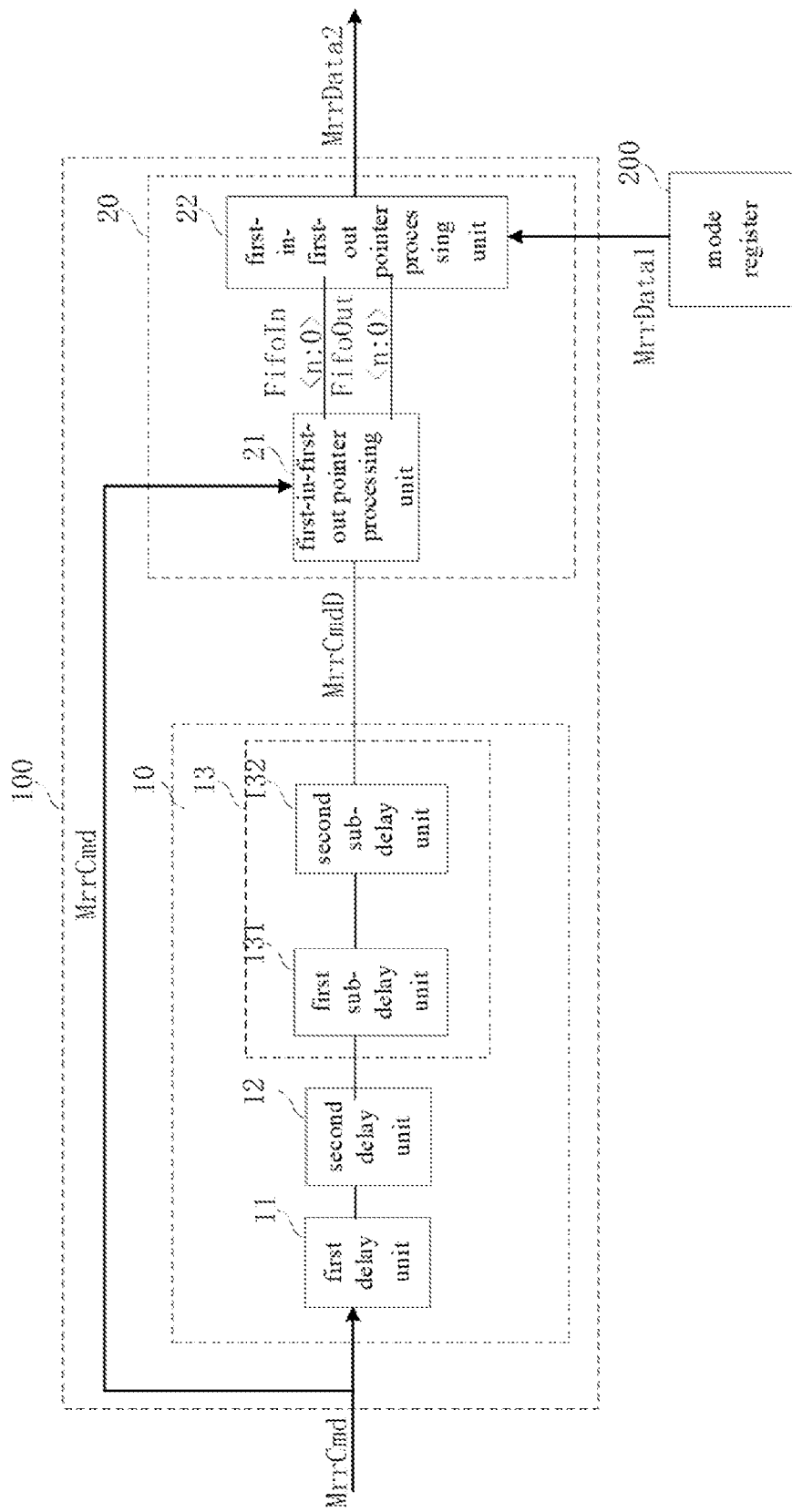
FIG. 4 is a structural block diagram of a data transmission circuit provided in the fourth embodiment of this disclosure.

Further, please refer to FIG. 4, in an embodiment of the present disclosure, the mode register data processing unit 20 further includes a first-in-first-out pointer processing unit 21 and a first-in-first-out data processing unit 22, the first-in-first-out pointer processing unit 21 and the output terminal of the delay module 10 is connected to generate the first pointer signal FifoIn<n:0> in response to the mode register read command MrrCmd, and also to generate the second pointer signal FifoOut<n:0> in response to the delayed read command MrrCmdD; the output data processing unit 22 is connected to the first-in first-out pointer processing unit 21 and the mode register 200, and is used to respond to the first pointer signal FifoIn<n:0> to read the setting parameter MrrData1 from the mode register 200, and is also used to respond to the setting parameter MrrData2 from the second pointer signal FifoOut<n:0> outputs. By setting the mode register, the data processing unit 20 includes a first-in-first-out pointer processing unit 21 and a first-in-first-out data processing unit 22, wherein the first-in-first-out pointer processing unit 21 generates a data processing unit for driving the first-in first-out data processing unit according to the mode register read command MrrCmd 22. By reading the first pointer signal FifoIn<n:0> of the setting parameter MrrData1 from the mode register 200, herein n can be equal to the bit width of the setting parameter MrrData1, and generate the output for driving the first-in first-out data processing unit 22 according to the delayed read command MrrCmdD. Set the second pointer signal FifoOut<n:0> of the parameter MrrData2 to control the time, when the response mode register read command MrrCmd reads the setting parameter MrrData1 from the mode register 200, thereby controlling the response mode register read command MrrCmd to read the setting parameters, the time of MrrData2 matches the time of reading the data in the array area in response to the data read command in the array area. In an embodiment of the present disclosure, the driving clock frequency of the first pointer signal FifoIn<n:0> and the second pointer signal FifoOut<n:0> are the same, so as to facilitate the realization of the precise control of the time difference between reading data and outputting data from the first-in first-out data processing unit 22.

Further, in an embodiment of the present disclosure, the first-in-first-out data processing unit includes a storage unit, and the output terminals of a plurality of the storage units are all connected to the same node; the storage unit includes a storage subunit and a drive. The input terminal of the driver is connected to the output terminal of the storage subunit, the storage subunit receives the setting parameters under the drive of the first pointer signal, and the driver outputs the setting parameters under the drive of the second pointer signal.

Figure 5:
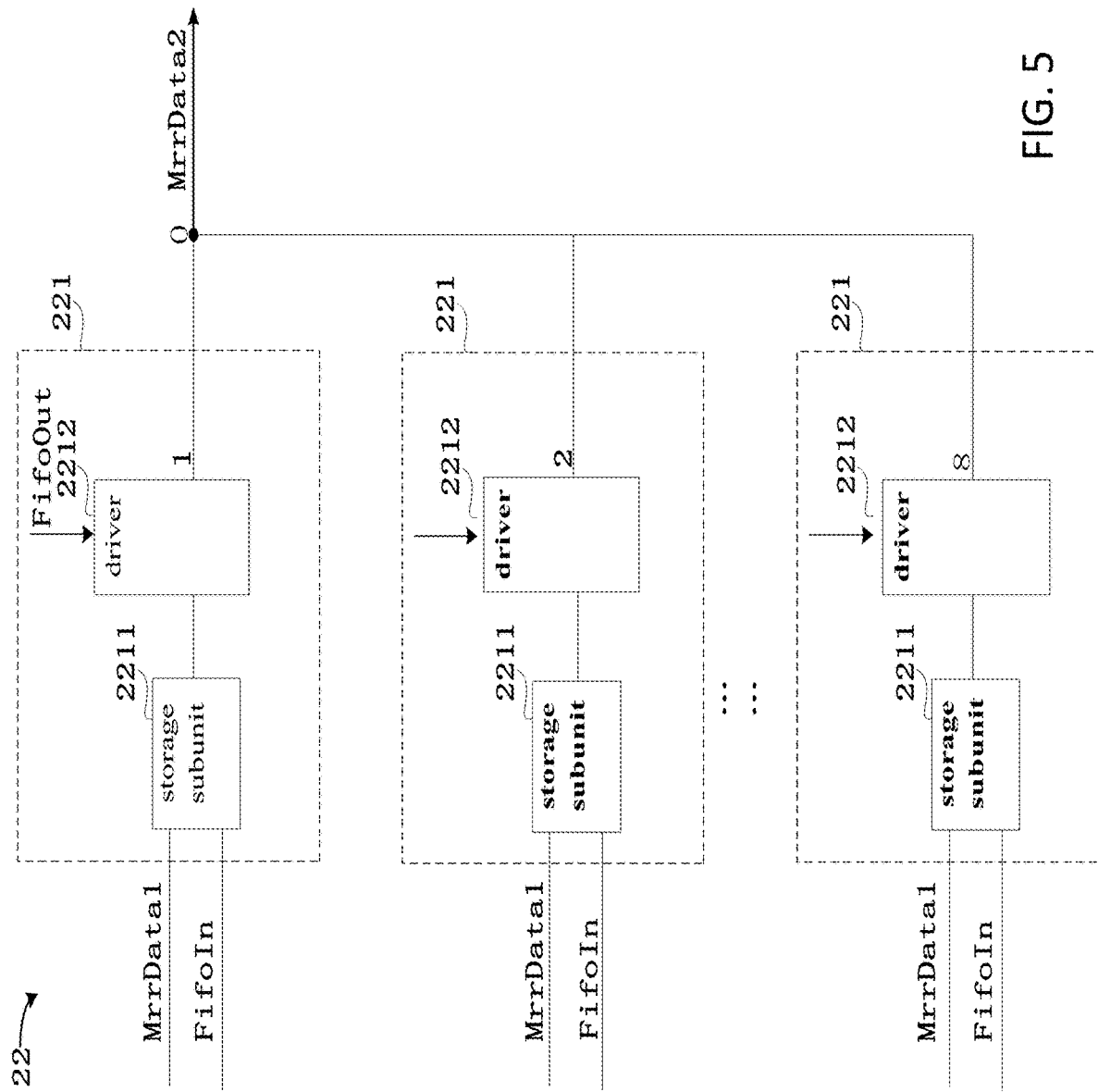
FIG. 5 is a structural block diagram of a first-in-first-out data processing unit in a data transmission circuit provided in an embodiment of the current disclosure.

As an example, please refer to FIG. 5. In an embodiment of the present disclosure, the first-in-first-out data processing unit 22 includes 8 storage units 221, and the output terminals of the 8 storage units 221 are all connected to node 0; the storage unit 221 includes storage subunit 2211 and the driver 2212. The input terminal of the driver 2212 is connected to the output terminal of the storage subunit 2211. The storage subunit 2211 is driven by the first pointer signal FifoIn<n:0> to receive the setting parameter MrrData1, n=8, and the driver 2212 driven by the second pointer signal FifoOut<n:0>, the setting parameter MrrData2 is output, so that the first-in first-out data processing unit 22 cooperates with the first-in first-out pointer processing unit 21 to read the settings from the mode register 200 for the response mode register read command MrrCmd, to realize the precise control of the time of the parameter MrrData1 and the time when the response mode register read command MrrCmd reads the set parameter MrrData2, when the data read out of the array area matches the time responded to the array data read command.

Figure 6:
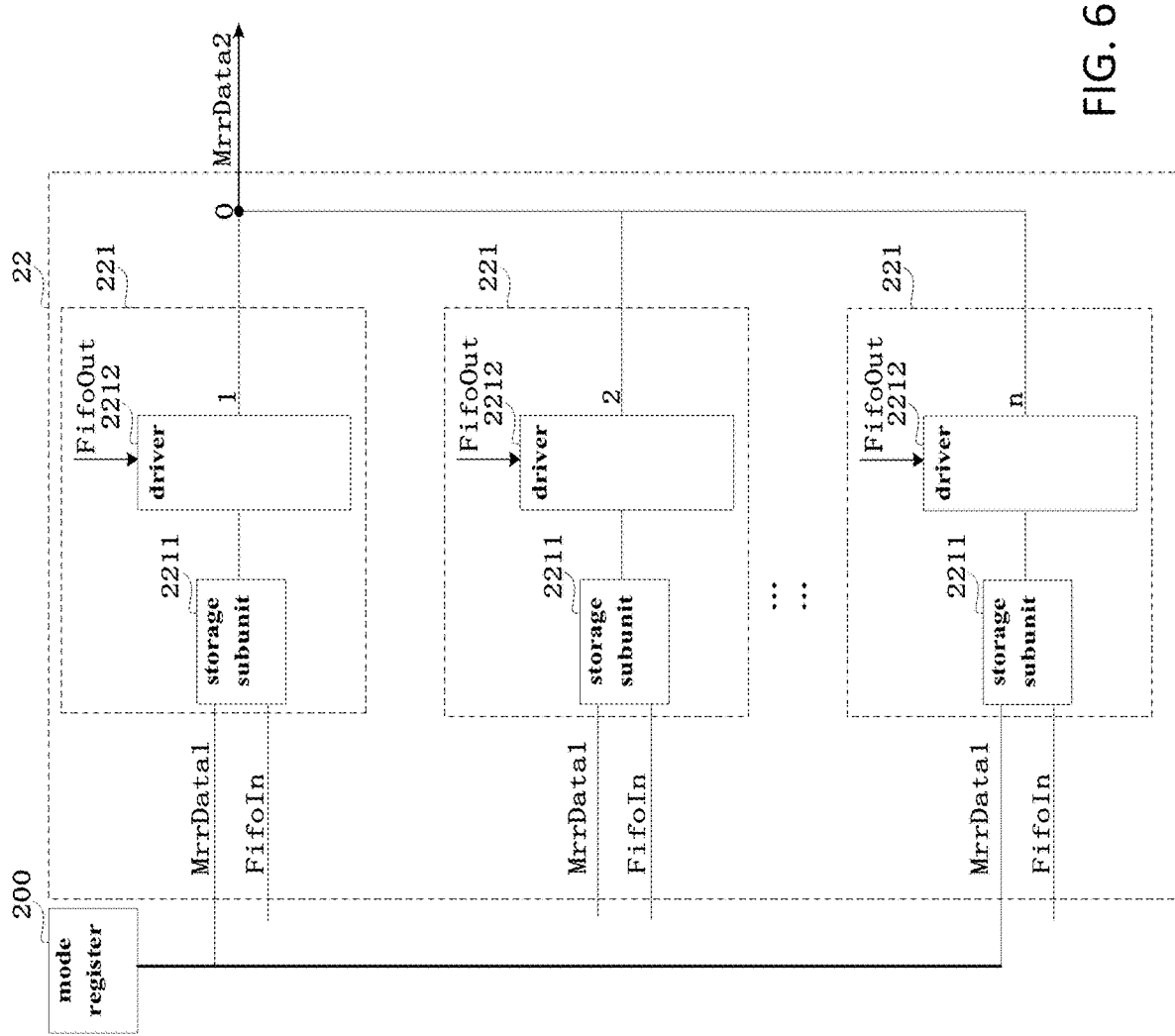
FIG. 6 is a structural block diagram of a first-in-first-out data processing unit in a data transmission circuit provided in another embodiment of the current disclosure.

As an example, please refer to FIG. 6. In an embodiment of the present disclosure, the data input terminal of each storage subunit 2211 is connected to the mode register 200, so that each storage subunit 2211 responds to the first pointer signal FifoIn<n:0> to read the setting parameter MrrData1 from the mode register 200.

Figure 7:
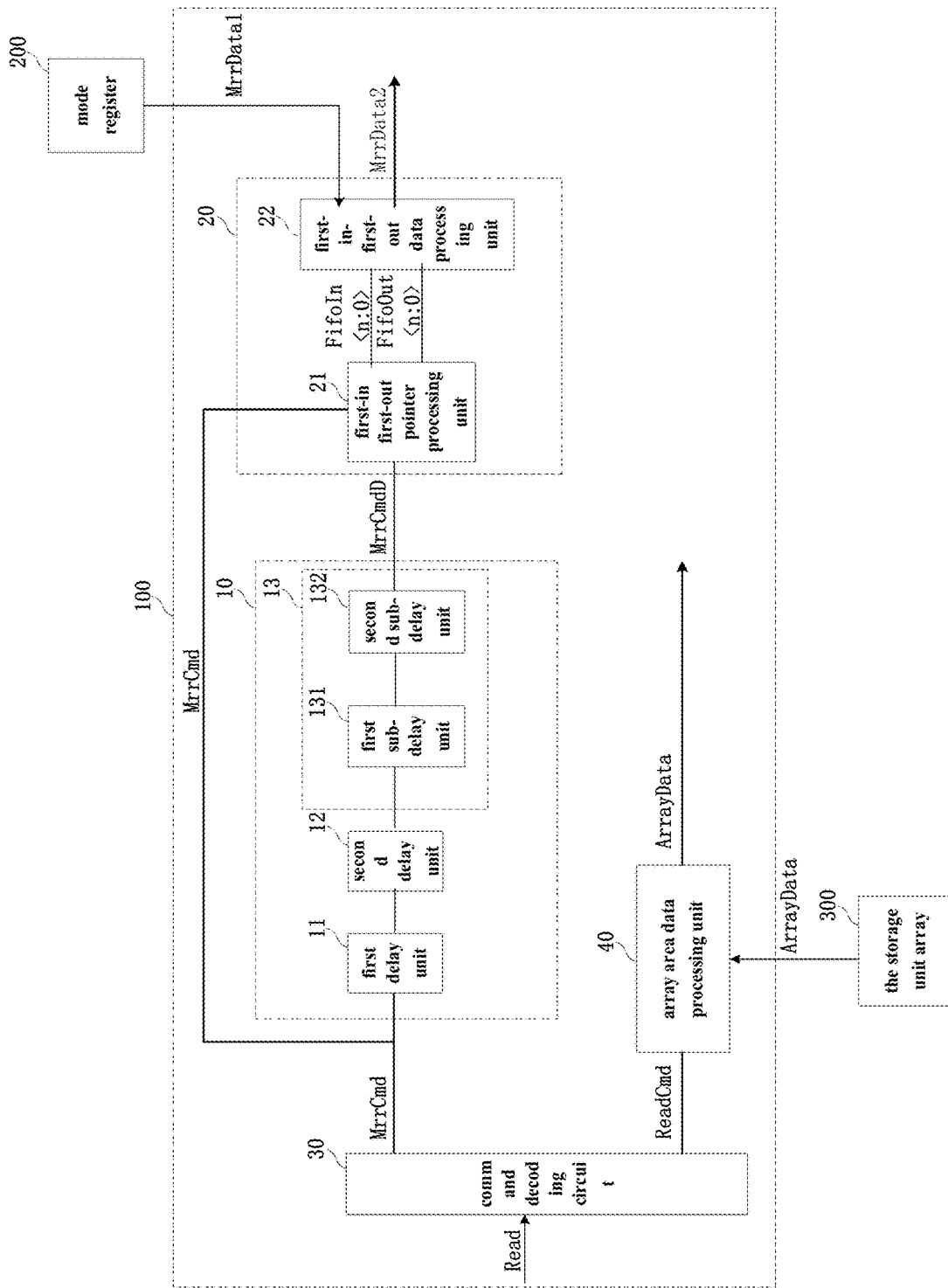
FIG. 7 is a structural block diagram of a data transmission circuit provided in the fifth embodiment of the current disclosure.

Further, please refer to FIG. 7, in an embodiment of the present disclosure, the data transmission circuit 100 further includes a command decoding circuit 30 and an array data processing unit 40, the first output terminal of the command decoding circuit 30 and the input of the delay module 10. The command decoding circuit 30 is used to receive the read command Read, decode the read command Read, and determine whether the read command Read is the mode register read command MrrCmd. If so, the command decoding circuit 30 outputs the mode register read command MrrCmd, on the contrary, the command decoding circuit 30 generates the array area data read command ReadCmd; the input terminal of the array area data processing unit 40 is connected to the second output terminal of the command decoding circuit 30 and the storage unit array 300 for responding the array area data read command ReadCmd, which reads the array area data ArrayData from the storage unit array 300. This embodiment realizes the reading of the setting parameter MrrData2 and the array data ArrayData through the data transmission circuit 100. Compared with using a different data transmission circuit 100 to read the setting parameter MrrData2 and the array data ArrayData in the mode register 200, this embodiment is effective because the area occupied by the data transmission circuit 100 is reduced, so as to further improve the integration level of the semiconductor storage device.

Further, please continue to refer to FIG. 7. In an embodiment of the present disclosure, the difference between the operation delay of the data processing unit 40 in the array area and the first preset time may be set to a preset threshold, so as to satisfy required operating parameters of a specific type of semiconductor storage devices such as Dynamic Random Access Memory (DRAM).

Figure 8A:
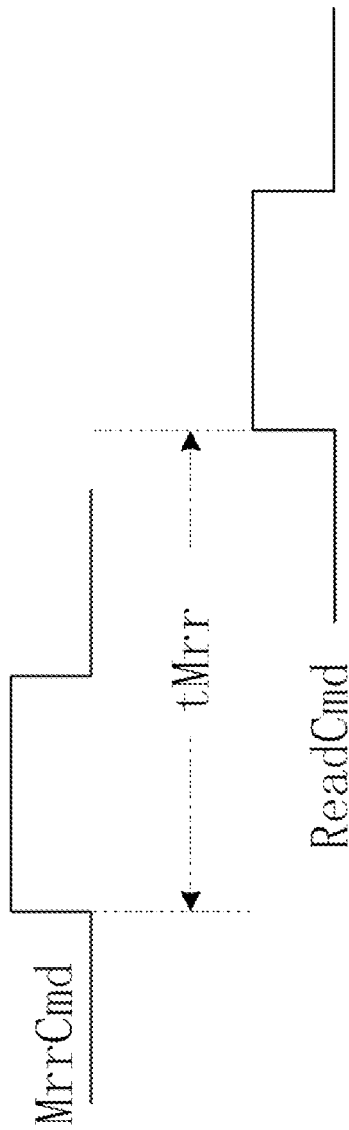
FIG. 8a is a schematic diagram of a response sequence of a data transmission circuit to a read command according to an embodiment of the current disclosure.
Figure 8B:
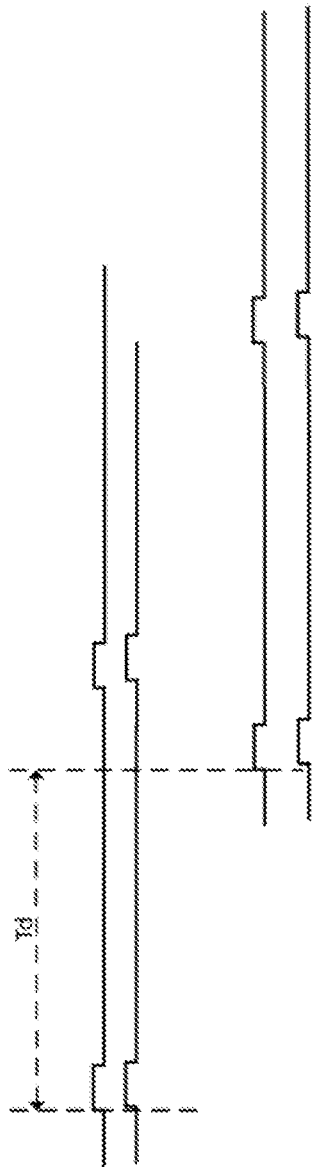
FIG. 8b is a schematic diagram of the working sequence of the data transmission circuit shown in FIG. 7.

As an example, please refer to FIGS. 8a and 8b. In an embodiment of the present disclosure, the frequency of the first pointer signal FifoIn<n:0> can be set to have the same frequency of the mode register read command MrrCmd, and the second pointer signal FifoOut<n:0> set at the same frequency as the delayed read command MrrCmdD, set the time difference between the drive time of the delayed read command MrrCmdD and the drive time of the mode register read command MrrCmd to the first preset time Td, set the difference of the operation delay of the array area data processing unit 40 from the first preset time as a preset threshold, so that the time for reading the set parameter MrrData in response to the mode register read command MrrCmd matches the time for reading the array data ArrayData in response to the array data read command ReadCmd.

As an example, in an embodiment of the present disclosure, the preset threshold can be set to an integer multiple of the column refresh period to meet the requirements of the operating parameters of a specific type of semiconductor storage device, such as LPDDR4.

Figure 9:
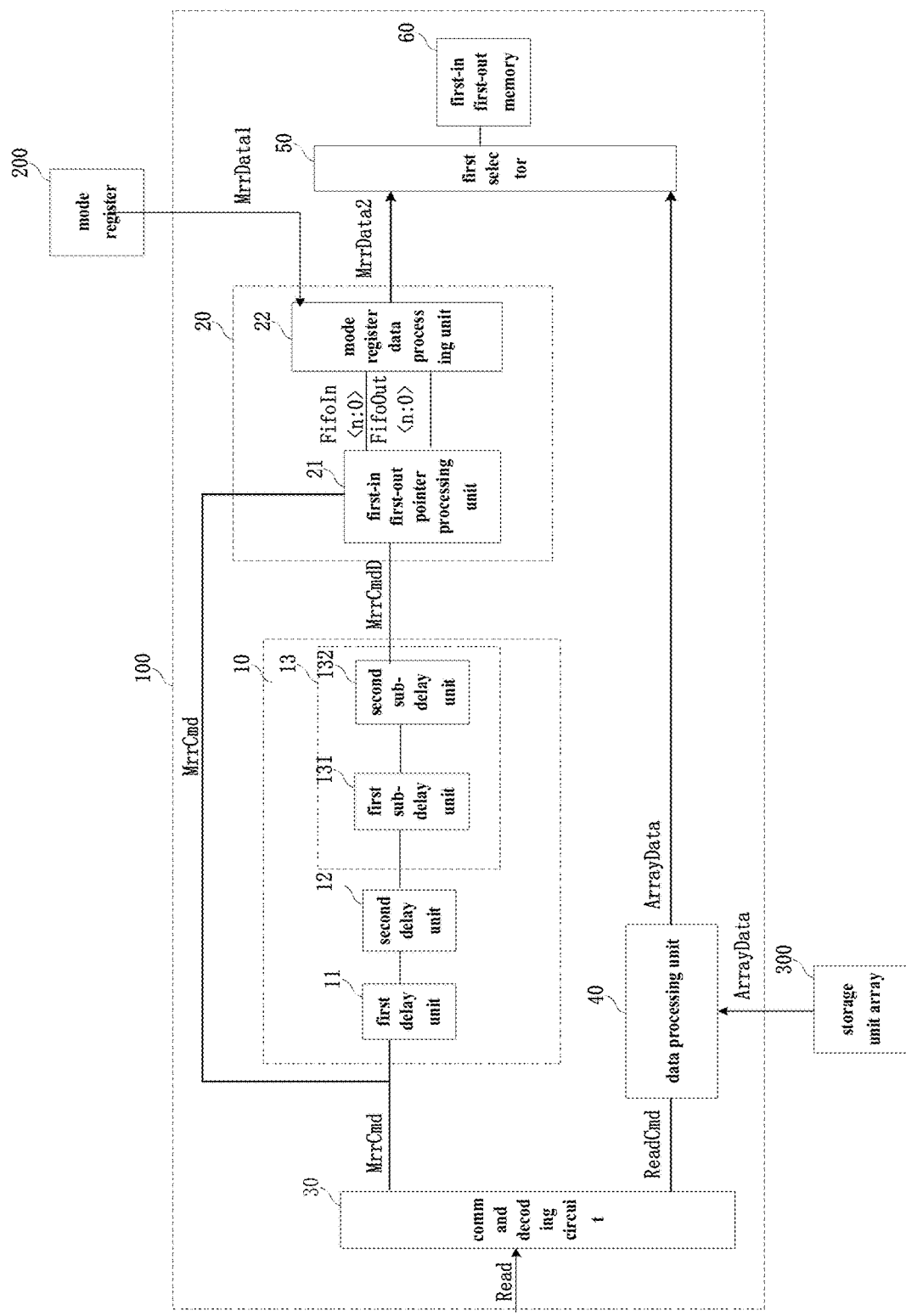
FIG. 9 is a structural block diagram of a data transmission circuit provided in the sixth embodiment of the current disclosure.

Further, please refer to FIG. 9, in an embodiment of the present disclosure, the data transmission circuit 100 further includes a first selector 50 and a first-in first-out memory 60, the first selector 50 and the output terminal of the data processing unit 40 in the array area and the output terminals of the mode register data processing unit 20 are connected; the first-in first-out memory 60 is connected with the output terminal of the first selector 50, and is used to store the setting parameter MrrData2 or the array data ArrayData. This embodiment can realize the transmission path of reading the setting parameter MrrData2 in response to the mode register read command MrrCmd, and the transmission path of reading the array data ArrayData in response to the array area data read command ReadCmd, share a data transmission channel, and pass the external output through the first-in first-out memory 60, thereby can effectively reduce the area occupied by the data transmission circuit 100.

Figure 10A:
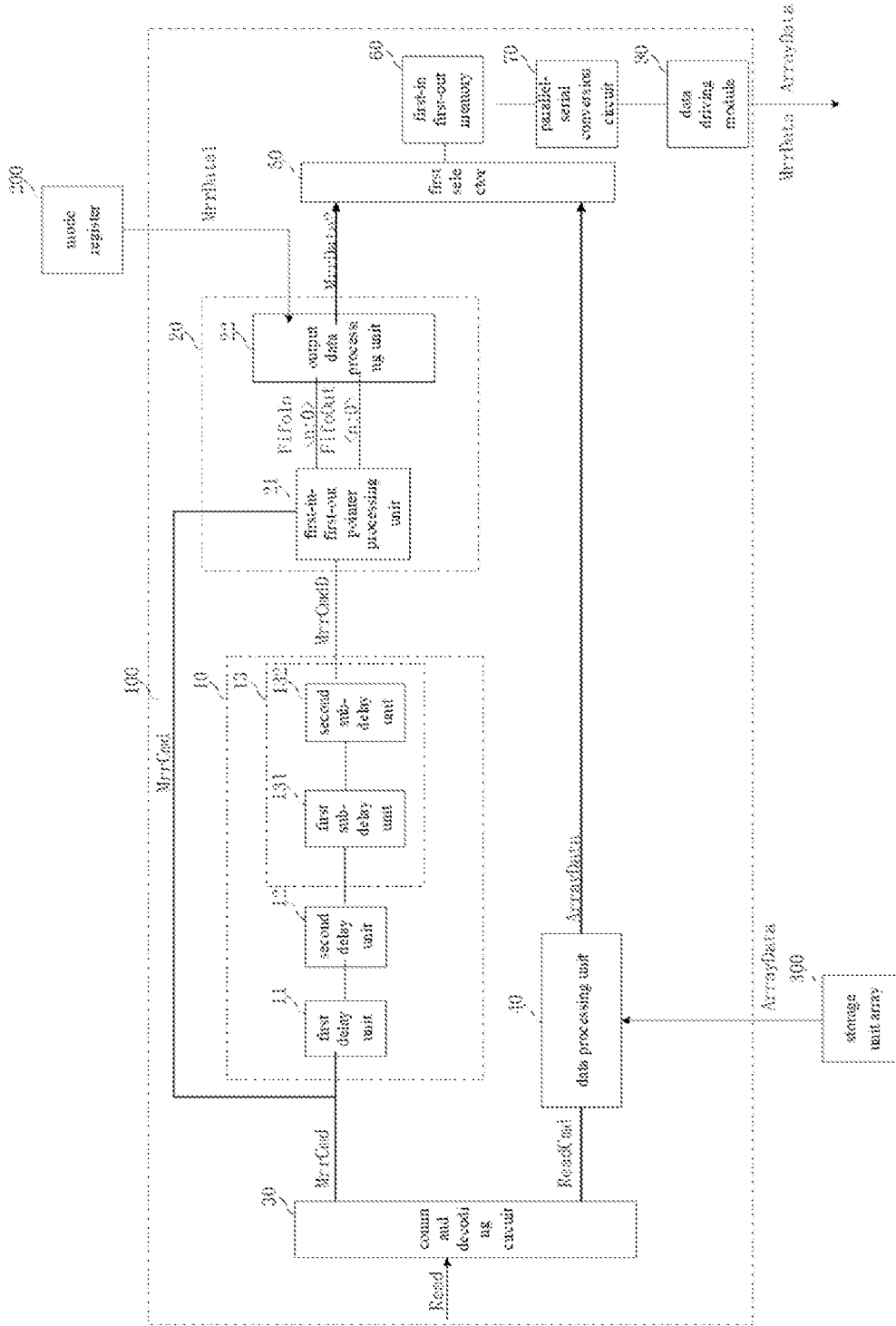
FIG. 10a is a structural block diagram of a data transmission circuit provided in the seventh embodiment of the current disclosure.
Figure 10B:
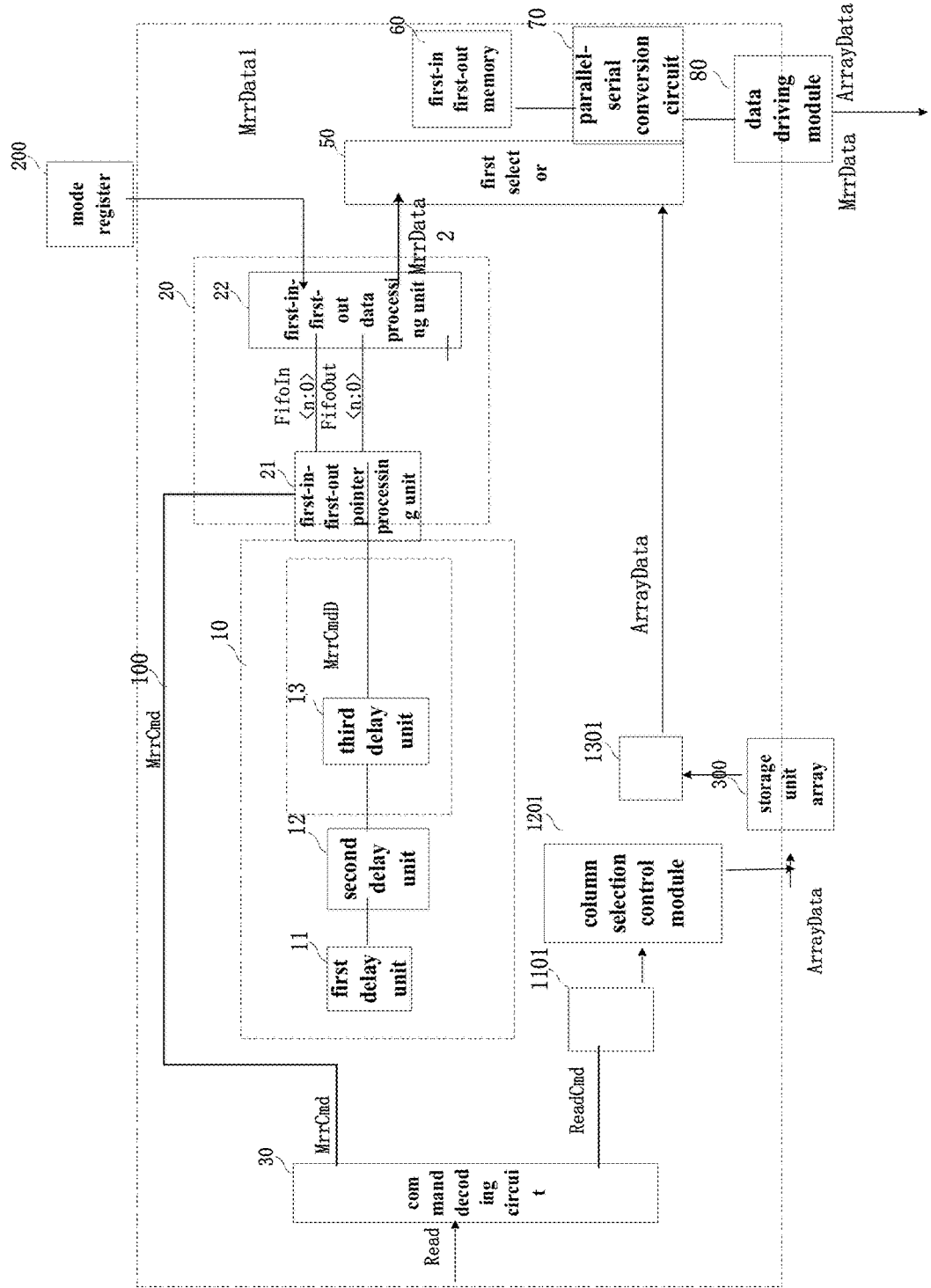

Further, referring to FIGS. 10a and 10b, in an embodiment of the present disclosure, the data transmission circuit 100 further includes a parallel-serial conversion circuit 70 and a data driving module 80, and the parallel-serial conversion circuit 70 and the output terminal of a first-in first-out memory 60 are connected. The data drive module 80 is connected to the output terminal of the parallel-serial conversion circuit 70 for outputting the setting parameter MrrData2 or the array data ArrayData. The serial conversion circuit 70 is provided to convert the serial data provided by the first-in first-out memory 60 into serial data and then output the serial data via the data driving module 80 to improve the efficiency of data transmission.

As an example, please continue to refer to FIG. 10b. The delay time of the array area data processing unit 40 responding to the array area data read command ReadCmd and reading the array area data ArrayData is equivalent to the delay time of the first read operation delay unit 1101 and column selection. The sum of the operation delay of the control module 1201 and the delay time of the third read operation delay unit 1301, the second delay unit 12 is set to replicate the operation delay of the column selection control module 1201, the delay time of the first delay unit 11 is set to match the first read delay time of the operation delay unit 1101, and the delay time of the third delay unit 13 is set to match the delay time of the third read operation delay unit 1301, so that the response mode register read command MrrCmd reads the time of the set parameter MrrData2 and the response array. The area data read command ReadCmd reads the time match of the array data ArrayData. For ease of understanding, as an example, continue to refer to FIG. 10b. For example, the delay time of the first read operation delay unit 1101 is 1 nanosecond, and the operation delay of the column selection control module 1201 is 1.5 nanoseconds (including the signal entering the column selection control module 1201). The delay time of the third read operation delay unit 1301 is 2 nanoseconds, then the delay time of the first delay unit 11 can be set to 1 nanosecond, and the delay time of the second delay unit 12 can be set to 1.5 nanoseconds, and the delay time of the third delay unit 13 is set to 2 nanoseconds, that is, the first delay unit 11 may have the same circuit structure as the first read operation delay unit 1101, and the second delay unit 12 the delay time for the column selection control module 1201 to operate the storage unit array 300 can be simulated (although the circuit structure is different, the delay time can be set to be the same), and the third delay unit 13 can have the same circuit structure as the third read operation delay unit 1301.

In this disclosure, the delay module 10 is set to generate the delayed read command MrrCmdD from the moment when the mode register read command MrrCmd is received and after the first preset time is delayed, so that the mode register data processing unit 20 responds to the mode register read command MrrCmd to read from the mode register 200 output the setting parameter MrrData1, and output the setting parameter MrrData2 in response to the delayed read command MrrCmdD; the delay time of the delay module 10 can be set according to specific needs, so that the response mode register read command MrrCmd reads the set parameter MrrData2 time and responds to the array area data read the time when the command reads the data in the array area matches. In this disclosure, it is possible to set the delay time of the delay module 10 to follow the operation delay of the functional module in the circuit for responding to the array area data read command to read the array area data, so that the delay module 10 and the followed functional module are affected by changes in the working environment consistently, which can effectively avoid control errors in the data transmission path due to the influence of the working environment.

Figure 11:
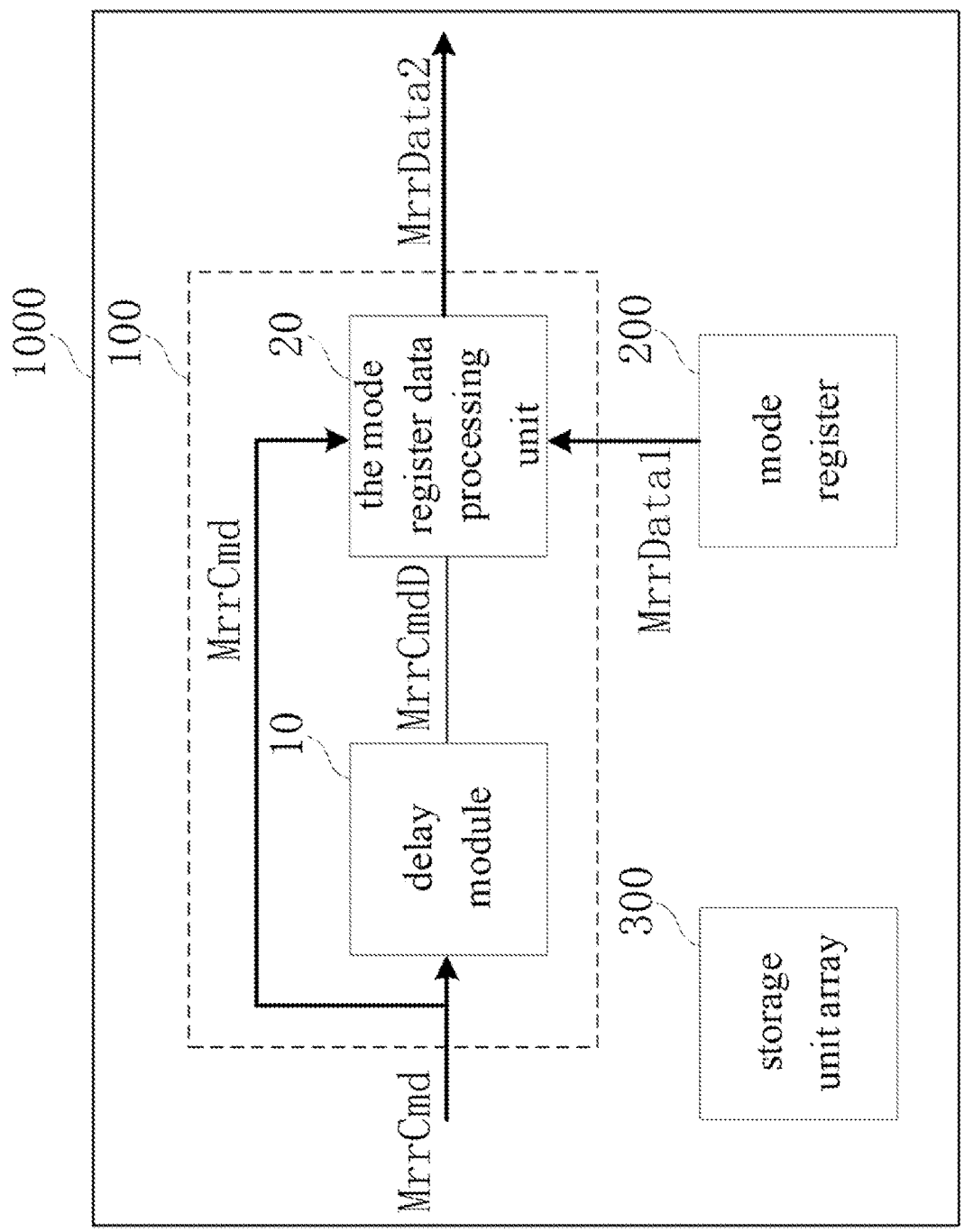
FIG. 11 is a structural block diagram of a storage device provided in an embodiment of the current disclosure.

Referring to FIG. 11, in an embodiment of the present disclosure, a storage device 1000 is provided, including a storage unit array 300, a mode register 200, and a data transmission circuit 100 as in any embodiment of the present disclosure. Since the data transmission circuit 100 in any of the embodiments of the present disclosure is used to transmit the array data ArrayData and the setting parameter MrrData2, the delay time of the delay module 10 can be set according to specific needs, so that the response mode register read command MrrCmd reads the setting parameters, the time of MrrData2 matches the time of responding to the array area data read command to read out the data in the array area, and realizes the transmission path of the response mode register read command to read out the setting parameters, and it shares the transmission path of the array area data in response to the array area data read command. A data transmission channel to reduce the area occupied by the data transmission circuit.

Figure 12:
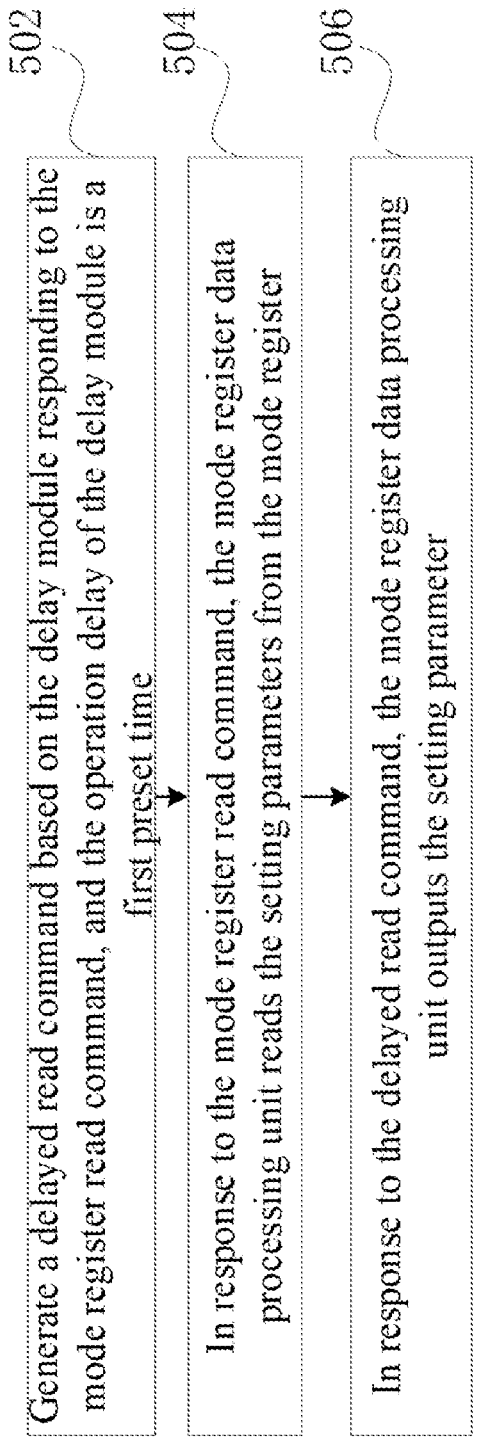
FIG. 12 is a schematic flowchart of a data transmission method provided in an embodiment of the current disclosure.

Referring to FIG. 12, in an embodiment of the present disclosure, a data transmission method is provided, including:

Step 502: Generate a delayed read command based on the delay module responding to the mode register read command, and the operation delay of the delay module is a first preset time;

Step 504: In response to the mode register read command, the mode register data processing unit reads the setting parameters from the mode register;

Step 506: In response to the delayed read command, the mode register data processing unit outputs the setting parameter.

Specifically, please continue to refer to FIG. 12, by controlling the delay module from the moment of receiving the mode register read command, after a first preset time delay, a delayed read command is generated, so that the mode register data processing unit responds to the mode register read command slave mode The register reads the setting parameters, and outputs the setting parameters in response to the delayed read command, so that the time of responding to the mode register read command to read the setting parameters matches the time of responding to the array area data read command to read the array area data. It realizes the transmission path for reading the set parameters in response to the mode register read command, and shares a data transmission channel with the transmission path for reading the data in the array area in response to the data read command in the array area, so as to reduce the area occupied by the data transmission circuit.

Figure 13:
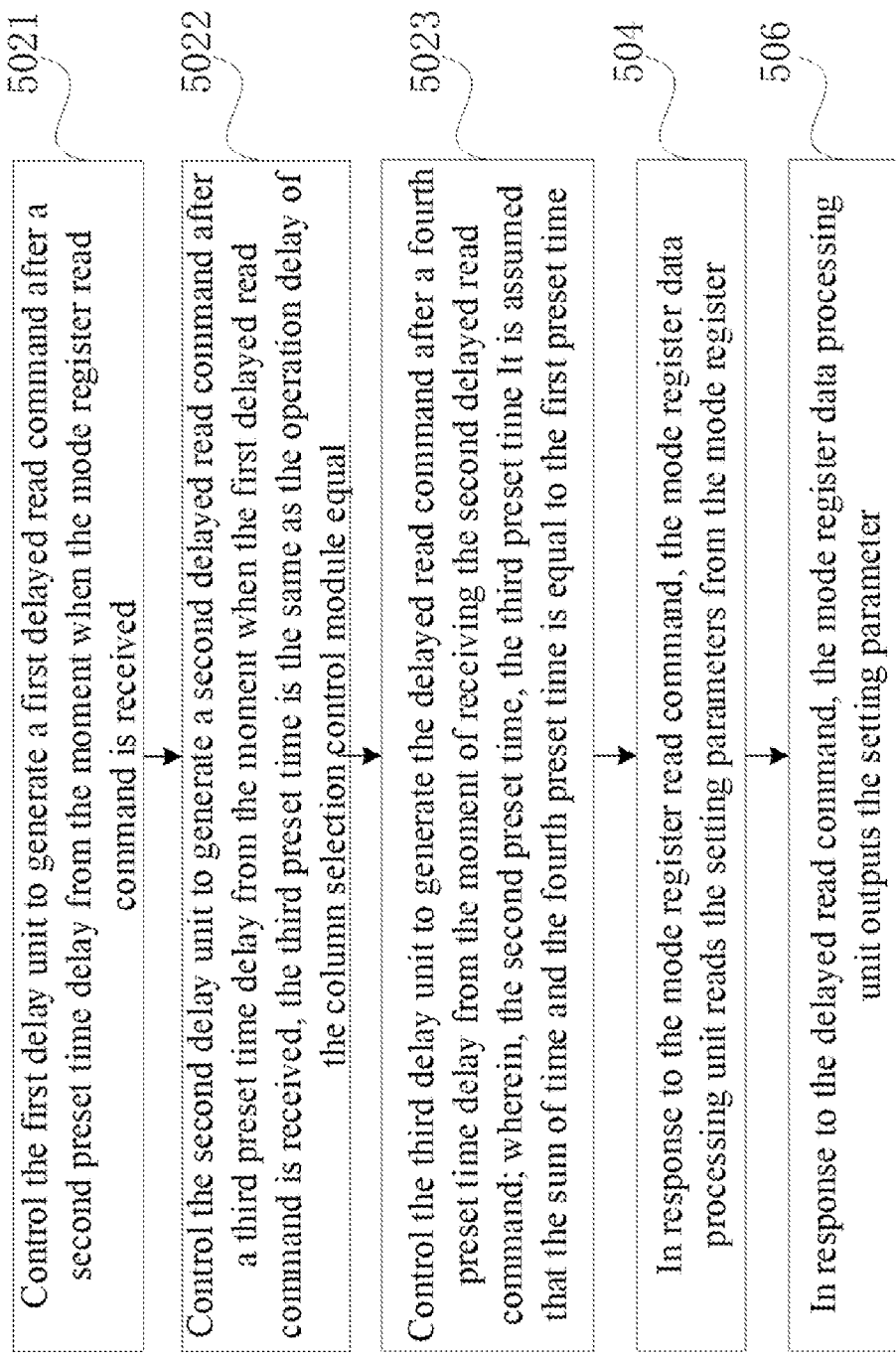
FIG. 13 is a schematic flowchart of a data transmission method provided in another embodiment of the current disclosure.

Further, please refer to FIG. 13, in an embodiment of the present disclosure, the delay-based module responding to the mode register read command to generate a delayed read command includes:

Step 5021: Control the first delay unit to generate a first delayed read command after a second preset time delay from the moment when the mode register read command is received;

Step 5022: Control the second delay unit to generate a second delayed read command after a third preset time delay from the moment when the first delayed read command is received, the third preset time is the same as the operation delay of the column selection control module equal;

Step 5023: Control the third delay unit to generate the delayed read command after a fourth preset time delay from the moment of receiving the second delayed read command; wherein, the second preset time, the third preset time It is assumed that the sum of time and the fourth preset time is equal to the first preset time.

Specifically, please continue to refer to FIG. 13, by controlling the first delay unit to generate the first delayed read command after a second preset time delay from the moment when the mode register read command is received; controlling the second delay unit to self-receive the first From the moment of the delayed read command, after a third preset time delay, a second delayed read command is generated. The third preset time is equal to the operation delay of the column selection control module; the third delay unit is controlled to receive the second delay. From the moment of the read command, the delayed read command is generated after a fourth preset time delay; wherein the sum of the second preset time, the third preset time, and the fourth preset time is the same as the sum of the fourth preset time The first preset time is equal; the time for responding to the mode register read command to read the setting parameters matches the time for responding to the array area data read command to read the array area data, and avoids the operation of the column selection control module in the specific type of semiconductor storage device The effect of delay on the transmission circuit.

Figure 14:
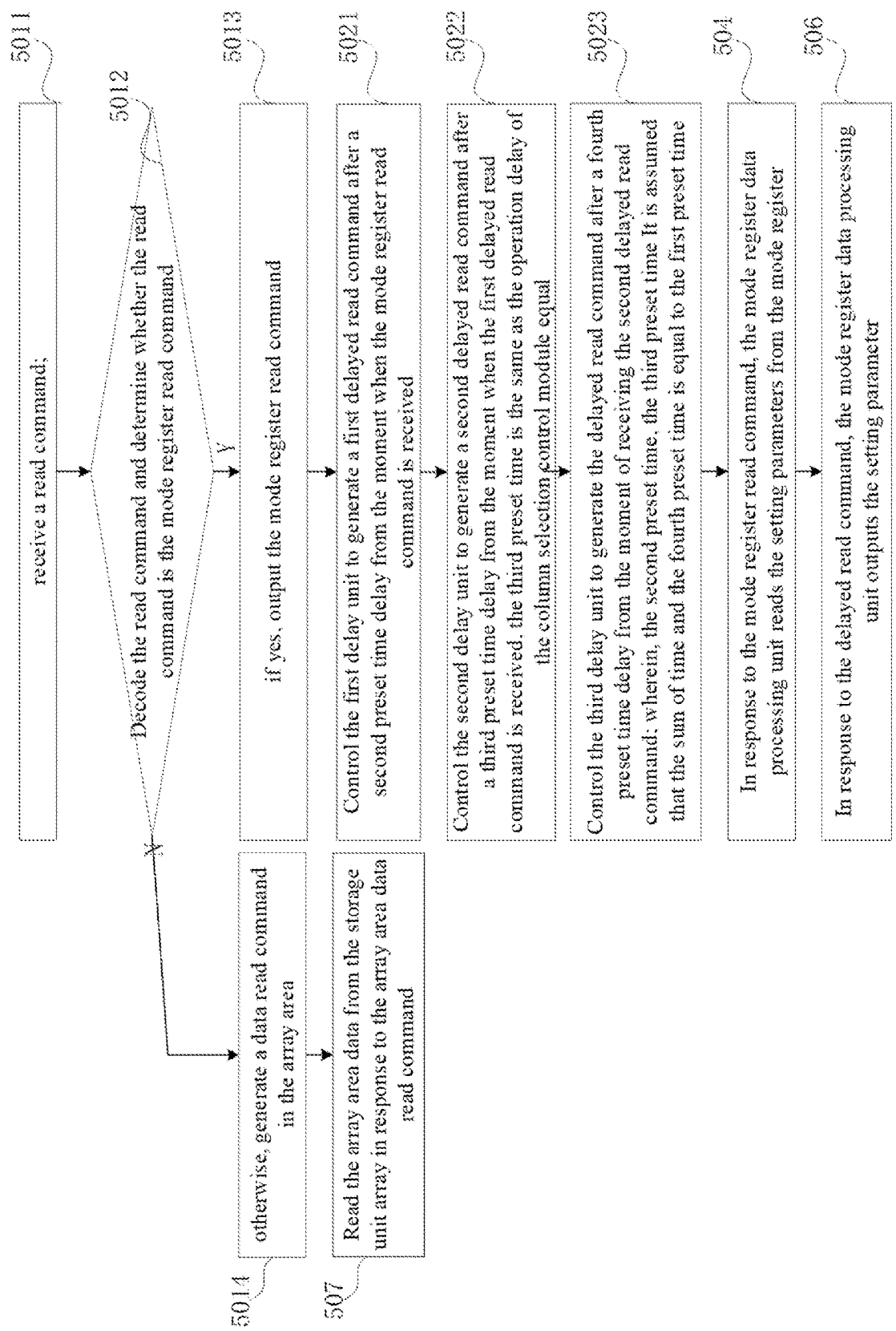
FIG. 14 is a schematic flowchart of a data transmission method provided in another embodiment of the current disclosure.

Further, please refer to FIG. 14. In an embodiment of the present disclosure, before the delay-based module responds to the mode register read command and generates the delayed read command, the method further includes:

Step 5011, receive a read command;

Step 5012: Decode the read command and determine whether the read command is the mode register read command;

Step 5013, if yes, output the mode register read command;

Step 5014, otherwise, generate a data read command in the array area;

Step 507: read the array area data from the storage unit array in response to the array area data read command.

Specifically, please continue to refer to FIG. 14 to decode the received read command and determine whether the read command is the mode register read command; if so, output the mode register read command; otherwise, generate the array area data read Command; then respond to the array area data read command to read the array area data from the storage unit array, based on the mode register data processing unit responds to the mode register read command to read the setting parameters from the mode register, and respond to the delayed read command and output In the setting parameter, the delayed read command is generated by the delay module after a first preset time delay from the moment when the mode register read command is received; the time for the response mode register read command to read the setting parameter is related to the response array area. The data read command reads out the data in the array area at a time matching, realizes the transmission path of the response mode register read command to read the setting parameters, and shares the data transmission channel with the transmission path of the array area data in response to the data read command in the array area, reducing the data. The transmission circuit occupies an area in order to further improve the integration level of the semiconductor storage device.

For the specific limitation of the data transmission method in the above embodiment, please refer to the above limitation of the data transmission device, which will not be repeated here.

It should be understood that although the various steps in the flowcharts of FIGS. 12-14 are displayed in sequence as indicated by the arrows, these steps are not necessarily performed in sequence in the order indicated by the arrows. Unless there is a clear description in this article, there is no strict order for the execution of these steps, and these steps can be executed in other orders. Moreover, at least part of the steps in FIGS. 12-14 may include multiple steps or multiple stages. These steps or stages are not necessarily executed at the same time, but can be executed at different times. The order of execution is not necessarily performed sequentially, but may be performed alternately or alternately with other steps or at least a part of the steps or stages in other steps.

A person of ordinary skill in the art can understand that all or part of the processes in the method of the foregoing embodiments can be implemented by instructing relevant hardware through a computer program. The computer program can be stored in a non-volatile computer readable storage. In the medium, when the computer program is executed, it may include the procedures of the above-mentioned method embodiments. Wherein, any reference to memory, storage, database or other media used in the embodiments provided in this disclosure may include non-volatile and/or volatile memory. Non-volatile memory may include read only memory (ROM), programmable ROM (PROM), electrically programmable ROM (EPROM), electrically erasable programmable ROM (EEPROM), or flash memory. Volatile memory may include random access memory (RAM) or external cache memory. As an illustration and not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronous chain Channel (Synchlink) DRAM (SLDRAM), memory bus (Rambus) direct RAM (RDRAM), direct memory bus dynamic RAM (DRDRAM), and memory bus dynamic RAM (RDRAM), etc.

Please note that the above-mentioned embodiments are only for illustrative purposes and are not meant to limit the present invention.

The technical features of the above-mentioned embodiments can be combined arbitrarily. In order to make the description concise, all possible combinations of the technical features of the above-mentioned embodiments are not described. However, as long as there is no contradiction in the combination of these technical features, they should be It is considered as the range described in this specification.

The above-mentioned embodiments only express several implementation modes of the present disclosure, and their descriptions are relatively specific and detailed, but they should not be understood as limiting the scope of the patent disclosure. It should be pointed out that for those of ordinary skill in the art, without departing from the concept of this disclosure, several modifications and improvements can be made, and these all fall within the protection scope of this disclosure. Therefore, the scope of protection of the patent in this disclosure shall be subject to the appended claims.

The invention claimed is:

1. A data transmission method, comprising:
generating a delayed read command based on a delay module responding to a mode register read command, wherein an operation delay of the delay module is the first preset time, wherein the delay module comprise a first delay unit, a second delay unit, and a third delay unit;
responding to the mode register read command, and reading setting parameters from the mode register based on a mode register data processing unit;
wherein the mode register data processing unit outputs the setting parameters, in response to the delayed read command;
generating, by the first delay unit of the delay module, a first delayed read command after a second preset time delay, when the mode register read command is received;
generating, by the second delay unit of the delay module, a second delayed read command after a third preset time delay when the first delayed read command is received, and wherein the third preset time equals to an operation delay of a column selection control module; and
generating, by the third delay unit of the delay module, a third delayed read command after a fourth preset time delay, when the second delayed read command is received;
wherein generating by the third delay unit of the delay module further comprises:
generating, by a first sub-delay unit of the third delay unit of the delay module, a third delayed read command after a fifth preset time delay, when the second delayed read command is received, wherein the fifth preset time is equal to an operation delay of a read-write amplifier; and
generating, by a second sub-delay unit of the third delay unit of the delay module, a first delayed read command after a sixth preset time, when the third delayed read command is received, wherein, a sum of the fifth preset time and the sixth preset time is equal to the fourth preset time;
wherein, a sum of the second preset time, the third preset time, and the fourth preset time is equal to the first preset time.

2. The data transmission method according to claim 1, wherein the delay module responds to the mode register read command to generate a delayed read command, wherein the method comprises:
controlling a first delay unit to generate a first delayed read command after a second preset time delay when the mode register read command is received;
controlling a second delay unit to generate a second delayed read command after a third preset time delay receives the first delayed read command, where the third preset time is equal to an operation delay of a column selection control module; and
controlling a third delay unit to generate the delayed read command after a fourth preset time delay, after receiving the second delayed read command; wherein a sum the second preset time, the third preset time, and the fourth preset time is equal to the first preset time.

3. The data transmission method according to claim 1, wherein before the delay module responds to the mode register read command and generates the delayed read command, the data transmission method further comprises:
receiving a read command;
decoding the read command and determining whether the read command is the mode register read command;
when the read command is the mode register read command, outputting the mode register read command; and
otherwise, generating an array area data read command in the array area; and
reading the array area data read command from a storage unit array in response to the array area data read command.

4. A data transmission circuit, comprising:
a delay module generating a delayed read command after a first preset time delay when a mode register read command is received; and
a mode register data processing unit, connecting to the delay module, wherein the mode register data processing unit reads setting parameters from the mode register in response to the mode register read command, and outputs the setting parameters in response to the delayed read command;
wherein the delay module comprise:
a first delay unit;
a second delay unit, which is connected to an output terminal of the first delay unit; and
a third delay unit, which is connected to an output terminal of the second delay unit and an input terminal of the mode register data processing unit;
wherein the first delay unit generates a first delayed read command after a second preset time delay, when the mode register read command is received;
wherein the second delay unit generates a second delayed read command after a third preset time delay when the first delayed read command is received, and wherein the third preset time equals to an operation delay of a column selection control module;
wherein the third delay unit comprises:
a first sub-delay unit, which is connected to the output terminal of the second delay unit; and
a second sub-delay unit, which is connected to an output terminal of the first sub-delay unit and the input terminal of the mode register data processing unit,
wherein the first sub-delay unit generates a third delayed read command after a fifth preset time delay, when the second delayed read command is received, wherein the fifth preset time is equal to an operation delay of a read-write amplifier;
wherein the second sub-delay unit delays a sixth preset time and then generates the delayed read command when the third delayed read command is received;
wherein, a sum of the fifth preset time and the sixth preset time is equal to the fourth preset time;
wherein the third delay unit delays a fourth preset time and generates the third delayed read command, when the second delayed read command is received; and
wherein, a sum of the second preset time, the third preset time, and the fourth preset time is equal to the first preset time.

5. The data transmission circuit according to claim 4, wherein the mode register data processing unit further comprises:
a first-in-first-out pointer processing unit, connected to the delay module, wherein an output of the first-in-first-out pointer processing unit comprises a first pointer signal in response to the mode register read command, and a second pointer signal in response to the delayed read command; and
a first-in-first-out data processing unit, connected to the first-in-first-out pointer processing unit and the mode register, wherein an input of the first-in-first-out data processing unit comprises a read out of the setting parameters from the mode register in response to the first pointer signal, and wherein an output of the first-in-first-out data processing unit comprises the setting parameters in response to the second pointer signal.

6. The data transmission circuit according to claim 5, wherein a driving clock frequency of the first pointer signal and a driving clock frequency of the second pointer signal are the same.

7. The data transmission circuit according to claim 5, wherein the first-in-first-out data processing unit comprises:
a plurality of storage units, wherein output terminals of the plurality of storage units are all connected to a same node;
wherein each one of the plurality of storage units comprises a storage subunit and a driver, wherein an input terminal of the driver is connected to an output terminal of the storage subunit, wherein the storage subunit receives the setting parameters under driving of the first pointer signal, and wherein the driver outputs the setting parameters under driving of the second pointer signal.

8. The data transmission circuit according to claim 7, wherein a data input terminal of each of the storage subunits is connected to the mode register.

9. A data transmission circuit, comprising:
a delay module generating a delayed read command after a first preset time delay when a mode register read command is received;
a mode register data processing unit, connecting to the delay module, wherein the mode register data processing unit reads setting parameters from the mode register in response to the mode register read command, and outputs the setting parameters in response to the delayed read command;
a command decoding circuit, wherein a first output terminal of the command decoding circuit is connected to an input terminal of the delay module and an input terminal of the mode register data processing unit, wherein the command decoding circuit receives a read command, decodes the read command, and determines whether the read command is the mode register read command; when the read command is the mode register read command, the command decoding circuit outputs the mode register read command, otherwise, the command decoding circuit generates an array area data read command; and
a data processing unit of the array area, wherein an input terminal of the data processing unit of the array area is connected to a second output terminal of the command decoding circuit and a storage unit array, wherein the data processing unit of the array area reads an array area data from the storage unit array in response to the array area data read command;
wherein a difference between an operation delay of the data processing unit in the array area and the first preset time is a preset threshold.

10. The data transmission circuit according to claim 9, wherein the preset threshold is an integer multiple of a column refresh period.

11. The data transmission circuit according to claim 9, further comprising:
a first selector, connected to an output terminal of the data processing unit of the array area and an output terminal of the mode register data processing unit; and
a first-in-first-out storage device, connected to an output terminal of the first selector, wherein the first-in-first-out storage device stores the setting parameters or the array area data.

12. The data transmission circuit according to claim 11, further comprising:
a parallel-serial conversion circuit, connected to the output terminal of the first-in first-out storage device; and
a data driving module, connected to an output terminal of the parallel-serial conversion circuit, wherein an output of the data driving module comprises the setting parameters or the array area data.

13. A storage device, comprising:
a storage unit array, for storing array area data;
a mode register, for storing setting parameters; and
a data transmission circuit according to claim 4.

* * * * *